United States Patent
Nieminen et al.

(10) Patent No.: US 9,684,051 B2
(45) Date of Patent: Jun. 20, 2017

(54) SYSTEM AND METHOD FOR PREPOLARIZING MAGNETIC RESONANCE- OR RELAXATION-BASED MEASUREMENTS

(75) Inventors: Jaakko Nieminen, Helsinki (FI); Cornelis Zevenhoven, Helsinki (FI); Panu Vesanen, Helsinki (FI); Risto Ilmoniemi, Helsinki (FI)

(73) Assignee: Aalto University Foundation, Aalto (FI)

( * ) Notice: Subject to any disclaimer, the term of this patent is extended or adjusted under 35 U.S.C. 154(b) by 734 days.

(21) Appl. No.: 14/112,039

(22) PCT Filed: Apr. 21, 2011

(86) PCT No.: PCT/FI2011/050367
§ 371 (c)(1),
(2), (4) Date: Dec. 12, 2013

(87) PCT Pub. No.: WO2012/143597
PCT Pub. Date: Oct. 26, 2012

(65) Prior Publication Data
US 2014/0084925 A1    Mar. 27, 2014

(51) Int. Cl.
*G01R 33/58* (2006.01)
*G01R 33/42* (2006.01)
(Continued)

(52) U.S. Cl.
CPC ........... *G01R 33/583* (2013.01); *G01R 33/42* (2013.01); *G01R 33/421* (2013.01); *G01R 33/445* (2013.01)

(58) Field of Classification Search
CPC .... G01R 33/583; G01R 33/42; G01R 33/421; G01R 33/445
See application file for complete search history.

(56) References Cited

U.S. PATENT DOCUMENTS

| 6,326,788 B1* | 12/2001 | Mulder | G01R 33/4215 324/309 |
| 2004/0066194 A1* | 4/2004 | Slade | G01R 33/3808 324/318 |

(Continued)

FOREIGN PATENT DOCUMENTS

WO    WO0025146 A1    5/2000

OTHER PUBLICATIONS

Burghoff, M. et al. SQUID Systems Adapted to Record Nuclear Magnetism in Low Magnetic Fields. IEEE Transactions on applied superconductivity Jun. 2007, vol. 17, No. 2 pp. 846-849, ISSN 1051-8223.

*Primary Examiner* — G. M. Hyder
(74) *Attorney, Agent, or Firm* — Seppo Laine Oy

(57) ABSTRACT

The invention relates to a prepolarizing magnetic resonance- or relaxation-based measurement system, comprising a prepolarizing coil for producing a prepolarizing field at the target zone, means for pulsing the prepolarizing field according to a first pulsing scheme, and means for measuring magnetization of a target placed in the target zone. According to the invention, the system further comprises a shielding coil for producing a shielding field and means for pulsing the shielding field according to a second pulsing scheme, whereby the shielding coil and the second pulsing scheme are arranged to reduce the formation of unwanted transient fields caused by the coupling of the prepolarizing coil to conducting or magnetic structures in the surroundings of the system. The invention also relates to a corresponding method of measurement and a process of designing the pulsing schemes for the system or process. By means of the invention, the formation of unwanted eddy currents, for example, in the surroundings of the measurement system, can be reduced.

23 Claims, 8 Drawing Sheets

(51) Int. Cl.
  *G01R 33/421* (2006.01)
  *G01R 33/44* (2006.01)

(56) References Cited

U.S. PATENT DOCUMENTS

| | | | |
|---|---|---|---|
| 2006/0091881 A1* | 5/2006 | Clarke | G01R 33/326 324/301 |
| 2010/0264921 A1* | 10/2010 | Horng | G01N 24/08 324/309 |
| 2012/0176130 A1* | 7/2012 | Ledbetter | G01N 24/08 324/301 |
| 2013/0072780 A1* | 3/2013 | Espy | A61B 5/05 600/409 |

* cited by examiner

SYSTEM AND METHOD FOR PREPOLARIZING MAGNETIC RESONANCE- OR RELAXATION-BASED MEASUREMENTS

FIELD OF THE INVENTION

The invention relates to magnetic resonance imaging (MRI), nuclear magnetic resonance (NMR) spectroscopy and other studies where a sample has to be magnetically polarized. In particular, the invention relates to reducing the unwanted effects of stray magnetic fields in prepolarized MRI with a novel polarisation coil arrangement. The invention is designed, in particular, to be applied in ultra-low-field (main magnetic field $B_0$<10 mT, in particular <1 mT) MRI (ULF MRI). Systems of the present kind comprise the features of the preamble of claim 1.

BACKGROUND OF THE INVENTION

Magnetic resonance imaging is capable of producing images of inner structure of matter. MRI is frequently used in hospitals and other medical or research facilities for diagnosing diseases and for research purposes. Remarkable exemplary areas of use are cancer diagnosis and brain research. ULF MRI has recently shown potential in these areas due to its excellent contrast between different kinds of tissues, like healthy and cancerous tissue.

While the state of the art of MRI has developed into multiple-tesla scanners, another approach has emerged, where the signal is measured in a magnetic field on the order of 100 μT. In ULF MRI, NMR occurs at corresponding low frequencies in the kilohertz range.

Prepolarized MRI is based on magnetizing a sample with a prepolarizing magnetic field and, for instance, measuring relaxation of the magnetization precession in a magnetic field that is typically lower than the prepolarizing field. Prepolarization in the stronger field is needed in order to achieve an acceptable signal to noise ratio (SNR). Each position in the sample to be imaged can be encoded using gradient magnetic fields such that, e.g, a 3D image of the sample can be mathematically reconstructed from the measured signals.

In addition to MRI, the prepolarization technique can be used, for example, in magnetic nanoparticle imaging (MNI) or in magnetorelaxometry (MRX). In MNI, the target is imaged with the help of small particles with suitable magnetic properties, which are generally administered into the object under study. In MRX, the magnetic relaxation properties of the target can be measured with or without the aim of forming an image of the sample. There are also other imaging and non-imaging measurement techniques utilizing prepolarization.

ULF MRI can be combined with magnetoencephalography (MEG), which utilizes ultra-sensitive SQUID sensors for detecting physiological electric currents in the human brain.

In order for the image quality to remain high despite the low main field $B_0$, the sample to be imaged needs to be prepolarized in a stronger magnetic field $B_p$, typically of the order of 10-200 mT, before the weaker, typically homogeneous, field $B_0$ and the gradient fields are applied for signal encoding. When the signal is measured with an untuned SQUID sensor, its amplitude is independent of $B_0$ and proportional to $B_p$. In ULF MRI, signal-to-noise ratio (SNR) is typically a limiting factor; thus, the imaging time for a given spatial resolution (voxel volume) depends on the SNR as $1/SNR^2$, which is proportional to $(B_N/B_p)^2$, where $B_N$ is the noise standard deviation. Therefore, the polarizing field should be as high and the noise level as low as possible to obtain high-quality images in a short imaging time.

Changing magnetic fields induce eddy currents in conducting structures nearby. The eddy currents cause magnetic interference in the sample and measurement equipment and may therefore disturb the measurement. This effect is of particular importance in combined MEG-MRI, as the detectors are ultra-sensitive and the measurements are done in a magnetically shielded room. Even if the detectors would not be disturbed, the eddy currents may be detrimental as they may destroy the spin dynamics in the sample to be imaged and set a practical limit for the strength and switch-off time of the prepolarizing field. In early studies, this has had the effect that the prepolarizing coils have been designed to be small and therefore not suitable for brain research, for example.

$B_N$ can be reduced by providing shielding against external noise sources. For ULF MRI at the kilohertz range, a light magnetically shielded room (MSR) having an aluminum layer around the measurement system together with gradiometric sensors are enough to render the external noise insignificant. If ULF MRI is combined with MEG, additional shielding at lower frequencies is usually needed. Such a shielding can be achieved with an MSR consisting of a few layers of mu-metal with high permeability, together with thicker layers of aluminum.

However, combining the shielding and high prepolarizing fields is problematic. Because the prepolarizing field has to be switched off rapidly, a large time derivative $\partial B_p/\partial t$ appears. With dipolar polarizing coil designs typically used, a strong stray field occurs with $B_p$. Thus, when a typical polarizing field is switched off, strong eddy currents are induced in the conductive layers of the magnetically shielded room. The induced eddy currents decay in a multi-exponential manner depending on the resistances and inductances of the conductive paths. The eddy currents cause secondary magnetic fields inside the MSR. If these fields are strong, they will affect the spin dynamics of the sample, reducing image quality, or, in the worst case, making image reconstruction practically impossible. A large drifting magnetic field may also exceed the dynamic range of the sensors.

In addition, such fields typically contain low-frequency components; thus, they may interfere with MEG recordings, frustrating simultaneous MEG-MRI.

The influence of eddy currents has been given attention to in high-field MRI, where the source is the rapid switching of the gradient fields. Eddy currents affect the field homogeneity and stability, producing image artifacts.

One of the most widely used techniques for minimizing eddy current-induced artifacts is to design gradient coils with weak stray fields. Low stray field gradient coils can be designed using numerical or analytical design methods. The patent publications U.S. Pat. No. 5,561,371, GB 2265986, EP 0749017 and U.S. Pat. No. 4,733,189 describe exemplary arrangements for high-field MRI, which have been designed to minimize the stray field of gradient coils.

These methods are not directly applicable to the prepolarizing coil in ULF MRI, prepolarized MRI, ULF NMR, prepolarized NMR, MNI, MRX, or, in particular, ULF MRI combined with MEG.

M. Burghoff et al., "SQUID systems adapted to record nuclear magnetism in low magnetic fields", IEEE Trans. Appl. Supercond., 17:846-849, 2007, disclose a system where a tiny solenoid is used to polarize the sample; an equivalent coil, with an opposite field direction, is placed beside the polarizing coil to reduce the stray field and to prevent the magnetization of the MSR walls. However, such a design becomes impractical when the sample volume and the strength of the polarizing field increase.

U.S. Pat. No. 4,978,920 discusses, in general level, screening of a magnetic field using the concept of "hypothetical superconductive shield" neutralizing the main field. The discussed geometry is, however, not suitable for pre-polarized ULF MRI or MRX, for example, in which the prepolarizing coil is typically a solenoid or other coil whose dipole moment is very large. Also the current required in the prepolarization coil is very large, whereby they produce a very strong magnetic field to the surrounding structures, including the MSR walls.

It is also known to rotate the sample during the measurement in order to raise the measurement frequency and further in order to be able to distinguish between disturbances from the surroundings of the measurement system and real signals arising from the sample. This approach is, however, quite impractical to implement in practice. Even more inconvenient, but in theory possible, would be to carry out the polarization and measurement of the sample at different locations.

Thus, there is a need for achieving more convenient and efficient methods and arrangements for minimizing the effect of prepolarizing-field-induced eddy currents in magnetic measurements.

SUMMARY OF THE INVENTION

The present invention is intended to provide a solution to the above-indicated need. Thus, the invention solves the problem of transient field-related and in particular eddy-current—related disturbances in prepolarized magnetic measurement techniques like ultra-low-field MRI, NMR, MRX and MNI and other applications.

The invention is based on the idea of providing, in addition to the prepolarizing coil and a first pulsing scheme, a shielding coil producing a shielding field, and means for pulsing the shielding field according to a second pulsing scheme, whereby the shielding coil and the second pulsing scheme are arranged to reduce unwanted transient magnetic fields, such as those caused by induced eddy currents, caused by the coupling of the prepolarizing coil to its surroundings. Generally speaking, the term "unwanted transient field" refers to any such field, which has a noticeable effect on the measurement concerned and is related to the coupling of the prepolarizing coil to the surroundings of the measurement system.

Throughout this specification and claims, the terms "prepolarizing coil" and "shielding coil" cover also arrangements comprising several coil units or subcoils, unless otherwise mentioned. Thus, the presence or a plurality of coils is not excluded and the terms may be replaced with "at least one prepolarizing/shielding coil". In some cases, the shielding coil and the prepolarizing coil may look like, or be treated as, a single coil.

More specifically, the invention is characterized by what is stated in the independent claims.

In this document, multipole moments, unless otherwise mentioned, refer to the spherical multipole moment expansion of the magnetic field that is used outside the volume containing the sources of the magnetic field. The spherical multipole moments are indexed with indexes (l,m), where for a given l, m=−l, −l+1, . . . l−1, l. In this document, the term lth multipole moment refers to the all spherical multipole moments with index l, i.e., (l,−l), (l,l+1), . . . , (l,l−1), (l,l). In addition, the multipole moments typically refer to the multipole moments per unit current flowing in a coil.

According to one embodiment, the shielding coil is arranged in series with the prepolarizing coil such that the same current flows in opposite directions in the coils. Thus, the same waveforms are fed in opposite directions to the coils. This approach is relatively simple to implement and has proven to result in acceptably low transient fields in the surroundings of the system.

Alternatively, the shielding coil can be a separate coil, to which current waveforms are actively fed separately to cancel the effects of the polarizing coil in surrounding conducting structures. This approach is called dynamic shielding or dynamic compensation in the following text. In dynamic shielding, the shielding and polarization coils are pulsed in a way that creates a desired polarizing field but harmful transients are made small. Dynamic shielding pulses can be designed for lower power, voltage, or current, or more effective polarization, or other desired properties compared to non-dynamic shielding. Dynamic shielding pulses can also be used to help relax coil design constraints.

According to one embodiment of dynamic shielding, different waveforms are fed to the prepolarizing coil and shielding coils to decrease the transient after the prepolarizing pulse. In this approach, the transients can be decreased even further and in a more flexible manner than in the case of identical waveforms fed to both prepolarizing and shielding coils. In addition, a higher prepolarization magnitude and energy savings can be achieved because the shielding field need not be active for the same period of time as the prepolarization field.

A model can be used in finding suitable waveforms of a shielding pulse for a polarizing pulse having a particular shape.

According to one embodiment, dynamic shielding pulses (and optionally also the polarizing pulses) are constructed using a function space where the waveform is represented by a finite set of values.

Suitable waveforms can also be found by using a convolution with a desired polarizing pulse. Alternatively or additionally, the waveforms can be found at least partially through measurements or through an iterative optimization algorithm.

According to one embodiment, the current pulse in the polarizing coil is modified together with the shielding pulse to compensate for the effect of the shielding pulse(s) on the field at the sample. Dynamic shielding is a flexible approach because it, for instance, allows for cancellation of prepolarization-induced disturbing signals of selected time constants only, and because it offers additional parameters that can be easily tuned. This is possible because the pulsing schemes can be individually changed and their mutual synchronization optimized.

According to one embodiment, the shielding coil is essentially coaxial with the prepolarizing coil and optionally around it. However, other geometrical configurations are possible too, as will be discussed in more detail later. According to one embodiment, the prepolarizing coil and the shielding coil are coaxial, have the same radii, but are not in the same plane. According to one embodiment, the shielding coil is smaller than the polarizing coil.

According to one embodiment, the prepolarizing coil and the shielding coil are not axially symmetric. Such a design is practical when geometrical constraints restrict the shape of the coils.

According to one embodiment there are provided two or more shielding coils which are driven with similar or dissimilar waveforms such that the prepolarizing field transient is decreased.

The invention also provides a process for determining first and/or second pulsing schemes for the measurement system or method described above. The process comprises one or both of the steps selected from
  a) producing, measuring or mathematically modeling at least part of the magnetic field pattern of the prepolarization coil or providing the field pattern of the prepolarization coil as pre-determined data, and producing, measuring or mathematically modeling at least part of the magnetic field pattern of the shielding coil or providing the field pattern of the shielding coil as pre-determined data,
  b) measuring or mathematically modeling the behavior of the measurement system comprising the prepolarization and shielding coils and conducting or magnetic structures in the surroundings of the coils or providing pre-determined data representing such behavior,
wherein the method further comprises
  determining, based on the measurements, modeling and/or pre-determined data of steps a) and/or b), pulses in the first and/or second pulsing schemes and their synchronization such that the formation of unwanted transient fields caused by the coupling of the prepolarizing coil to the conducting or magnetic structures in the surroundings of the coils is reduced compared with a situation without the shielding coil.

According to one particular embodiment, the method comprises mathematically modeling the formation of unwanted transients due to the coupling of currents in the prepolarizing and/or shielding coils to their surroundings, and determining pulse waveforms in the first and/or second pulsing schemes and their synchronization based on computation according to the model. According to a further embodiment, the field patterns of the prepolarization coil and/or the shielding coil are mathematically modeled. If the conducting or magnetic structures are modeled too, the behaviour of the transient field can be simulated and the whole pulsing scheme determination process can be carried out on computing means.

According to another particular embodiment, at least one of the field patterns, preferably both, is/are produced in the real measurement environment, i.e. in the presence of the conducting or magnetic structures in the surroundings for finding out the real behavior of the system. The response of the system can be measured for finding out the transient fields. Based on the measurement, the pulsing schemes can be optimized for low transient fields. The measurement/determination process can be iterative.

Also combinations of the two basic process embodiments are possible.

The pulses in the first and/or second pulsing schemes are preferably determined at least partly automatically in data processing means, such as a computer, using suitable software means. The data processing means and software means can be part of the measurement system such that optimal pulsing schemes can be easily found even if there are changes in the surroundings of the system.

The invention provides significant advantages. First, the shielding coil can effectively neutralize the dipole moment of the polarizing coil, which has the result that the strength of eddy currents in the surrounding structures is reduced drastically. The shielding coil can be designed to not greatly influence the field strength in the target, which is placed inside or in the vicinity of the polarizing coil. Thus, the polarization and the signal strength are not compromised. The optional series coupling has the additional advantage that the phase of the current remains the same in both coils and the shielding efficiency is independent of the polarization pulse shape or resistances of the coils as they warm up or cool.

In addition to preventing eddy currents, the invention prevents magnetization of nearby material such as mu-metal of magnetically shielded rooms.

According to experimental studies, ULF MRI has great potential in providing scientifically or clinically relevant information about human tissues. According to the experiments, it is rather difficult to produce ULF-MRI images of high quality in a magnetically shielded room without utilizing the present invention. It has been shown that without a shielding coil, the polarization field strength needs to be limited compared with the field strength that can be used with the present invention. The imaging time required is inversely proportional to the square of the amplitude of the polarizing field. Thus, the invention significantly contributes to shortening the imaging sessions, which has a direct positive effect on patient comfort and the cost of an imaging session.

Combined MEG and MRI may in certain cases offer a preferred substitute for functional MRI (fMRI). For example, it may be difficult to image children or certain other special subject or patient groups in high-field magnets. In addition, the invention has potential in MNI, MRX, NMR, and MRI, or any method requiring a pulsed polarizing field that can be extremely strong (10 T or even higher) if the imaging volume is kept small.

One fundamental difference between prepolarized MRI and traditional MRI, which has been taking advantage of known main field and gradient field coil shielding arrangements, is that the polarization field in prepolarized MRI needs not be, and typically also is not, homogeneous or linearly varying in space. The inhomogeneity of the prepolarizing field in the target area can be, for example 50% or more; as long as the polarizing field is strong within the whole region of interest, its homogeneity is unessential. Therefore, also the shielding coil can be designed with the main aim of minimizing the stray field and eddy currents. This observation has allowed the inventors to design a very efficient system. In other words, the present invention is especially useful when the polarizing field homogeneity requirements within the imaging volume are weak. However, by considering the multipole expansion of the coil in the interior region too (in a similar way than used to deal with the commonly known multipole expansion outside the current sources), constraints for the field within the imaging region can be set. The present approach can be used to design self-shielded coils with arbitrary geometrical constraints, allowing one to find coils that produce good shielding against eddy currents, are easy to manufacture, and fit in existing or new ULF-MRI systems.

According to a preferred embodiment, the shielding coil has an outer dimension which is at least twofold compared to a corresponding outer dimension of the prepolarizing coil. The term "outer dimension" is defined as the maximum distance between two points of the conductor material of the coils. The ratio of these dimensions is typically 2 . . . 10. Such coils have been found to effectively minimize the stray field without having a great effect on the polarization of the target.

According to one embodiment, the prepolarizing coil has the form of a solenoid. A solenoid comprises a single turn or a plurality of turns of conducting material in cylindrical configuration. The length of the solenoid may be small or large in comparison to the coil's other dimensions. In this case, also the shielding coil can have the form of a solenoid, whose diameter is preferably at least twofold compared to that of the prepolarizing coil. Solenoids are relatively easy to manufacture and suitable for most practical purposes.

According to one embodiment, the shielding coil has the form of a solenoid with equally spaced turns.

According to another embodiment, the shielding coil has the form of a solenoid in which the distance between adjacent turns in the middle of the solenoid is larger than the distance between adjacent turns at the ends of the solenoid (along the length axis of the solenoid).

According to yet another embodiment, the shielding coil comprises a symmetric pair of coils, i.e., two coil sections spaced apart from each other, each section comprising a plurality of turns. This coil resembles a Helmholtz coil. According to another embodiment, the shielding coil comprises of more than one pair or individual subcoils.

According to yet another embodiment, some parts of the polarizing and shielding coils are superconducting.

According to one embodiment, the coil used to create the main measurement field for, e.g. MRI, is used at least partly as at least part of the shielding coil. Such an arrangement is practical when the polarizing field and the main field point both essentially in the same direction.

According to another embodiment, some of the lowest multipole moments of the self-shielded polarizing coil are not totally nulled, but instead they are kept constant. Here, the multipole moments are absolute, i.e., not per unit current. For example, when the current in the polarizing coil is switched off, a current in a larger shielding coil is increased to keep the dipole moment of the coil static in time. If the shielding coil is large, it produces only a small field at the target zone and can be left on during the acquisition period. It is also possible to use the shielding coil to generate other fields needed after the polarization period. When the multipole moments are constant, they do not produce eddy currents.

The prepolarizing coil is preferably placed in the symmetry center of the shielding coil.

The shielding coil can also be designed to be nonsymmetric in order to facilitate its placement within the measurement apparatus. In such an arrangement, it is preferable that the total dipole moment of the prepolarization and the shielding coil is close to zero and that the relative placement of the coils is such that the quadrupole moments of the configuration is also small.

Further improvements in the suppression of eddy currents in conducting structures surrounding the apparatus can be achieved by designing the shielding coil so that in addition to the dipole and quadrupole moments of the combination of the polarization and shielding coils, also one or more successively higher multipole moments become close to zero.

Typically, the apparatus of the present kind is placed in a magnetically shielded room comprising one or more conductive layers intended to prevent external magnetic signals from interfering with the measurement. The shielding coil is optimized to prevent the formation of eddy currents in these conductive layers.

Next, embodiments and advantages of the invention will be discussed in more detail with reference to the attached drawings.

DETAILED DESCRIPTION OF EMBODIMENTS

The method according to the invention is intended to reduce the effects of eddy currents flowing in surrounding structures in prepolarizing magnetic resonance imaging, magnetorelaxometry and other nuclear magnetic resonance- or relaxation-based measurements that utilize prepolarization. In the method, undesired transient effects relating to the changing of magnitude of the prepolarization field are decreased by a shielding field produced by a shielding coil which is pulsed together with the polarizing field to suppress the unwanted effects of the coupling of the polarizing field to surrounding conductive or magnetizable structures.

Figure 1:
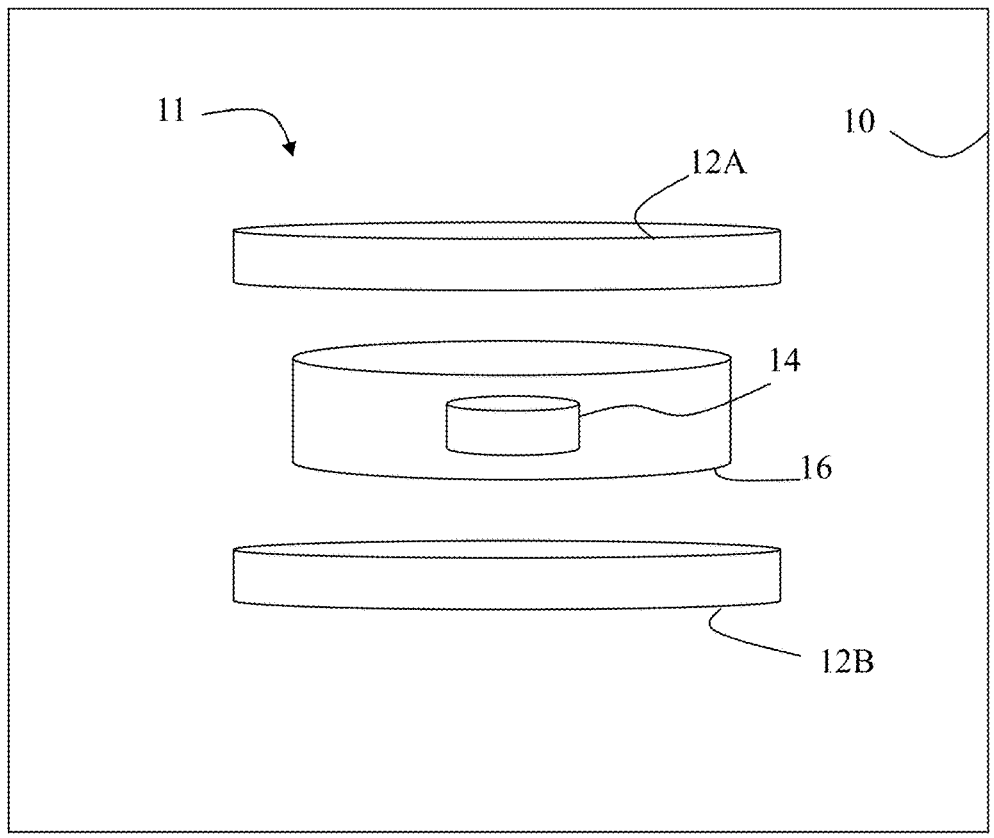
FIG. 1 illustrates a measurement system according to one embodiment of the invention.

FIG. 1 shows the general principle of the invention in an exemplary configuration. The imaging device 11 is placed in a magnetically shielded room 10. The imaging device comprises means for producing the main magnetic field, such as coils or permanent magnets 12A, 12B. In this case, the main field is vertical. Positioned in the main field, there is a prepolarizing coil 14, which is capable of producing a vertical field much stronger than the main field. The prepolarizing coil is situated around or near the target area. Around the prepolarizing coil, there is the shielding coil 16. The shielding coil 16 can be connected in series with the prepolarizing coil 14 or otherwise arranged so that the current in the shielding coil 16 reduces the induced eddy currents or magnetization, e.g., by being in phase with the current in prepolarizing coil 14. The directions of currents in the coils are typically opposite, i.e., field-cancelling. Different pulsing options and schemes are discussed later in more detail. According to one embodiment, the shielding coil 16 is adapted to reduce the polarization field in the target area by 10% at most. Thus, its number of turns should be sufficiently low and dimension sufficiently high with respect to corresponding factors of the prepolarizing coil 14.

According to one embodiment, the shielding coil is configured so as to cancel the field amplitude of the prepolarizing coil to the level of 20%, preferably to the level of 5% or less at maximum at the distances greater than 1 m from the surface of the prepolarizing coil. Such reduction of stray field can be implemented using the coil geometries herein described and has been found to dramatically reduce the eddy currents such that measurements are possible shortly after the prepolarization field has been turned off.

According to one embodiment, the shielding coil 16 is configured so as to cancel at least the first two, preferably the first four, magnetic multipole moments of the prepolarizing coil 14 to the level of 10% or less and even 5% or less of their initial values, provided that they are not zero or insignificant initially. "Zero or insignificant" in this context means that their contribution, when unshielded, to the unwanted transient fields to be cancelled is less than 10% of the total strength of the transient fields at a distance from 1 m of the system (more specifically: 1 m of the surface of the prepolarization coil). For example, the quadrpole moment may be initially zero or insignificant and needs not be cancelled. In fact, such multipole moment may even increase due to shielding without adversely affecting the overall result. The increase should, preferably, not be such that these multipole moment are in the end higher than one of the cancelled multipole moments.

Figure 2A:
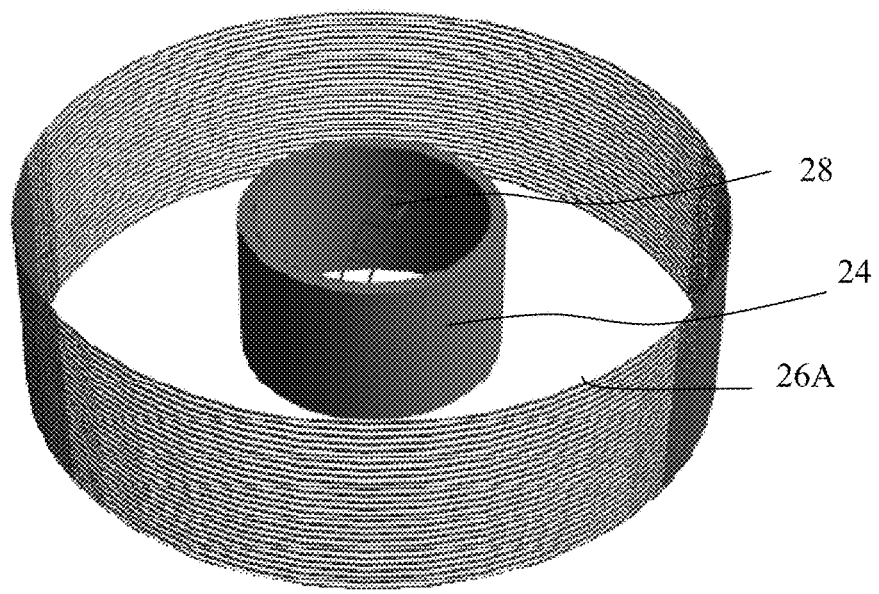
FIG. 2A shows in a perspective view a polarizing coil (inner) and a shielding coil (outer) with equally spaced turns according to one embodiment of the invention.
Figure 2B:
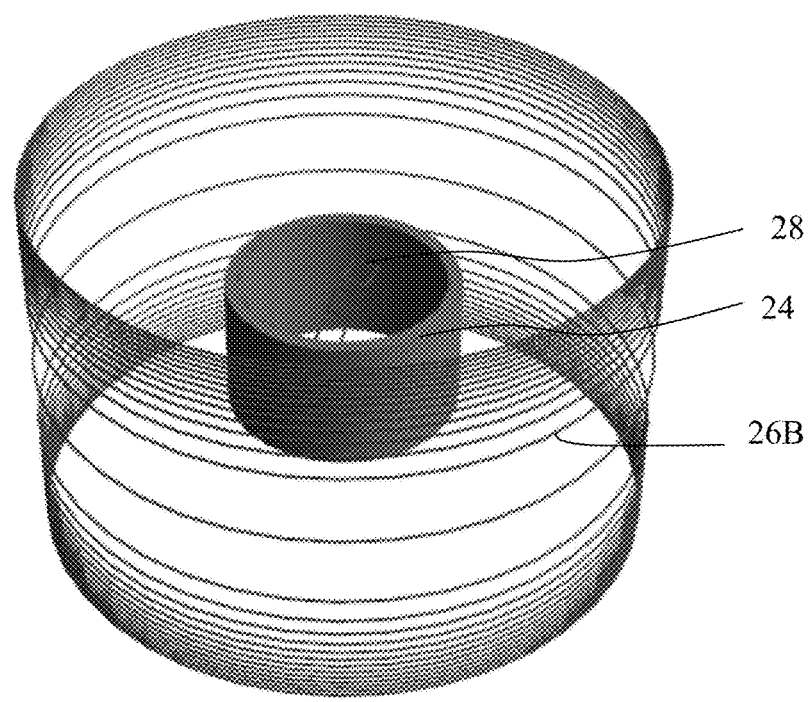
FIG. 2B shows in a perspective view a polarizing coil (inner) and a shielding coil (outer) with non-equally spaced turns according to another embodiment of the invention.

FIG. 2A shows this kind of coil arrangement according to one embodiment in more detail. The prepolarizing coil 24 is a solenoid. FIG. 2A also illustrates the positioning of SQUID sensors 28 in the target area. Around the prepolarizing coil 24, there is a shielding coil 26A shaped also to be a solenoid with equally spaced turns. The diameter ratio of the coils and number of turns ratio of the coils can be, for example, 1:3 and 9:1 (prepolarizing coil:shielding coil), respectively FIG. 2B shows an alternative shielding coil 26B with non-equally spaced turns. The turns in the middle of the shielding coil 26B are more sparsely positioned than in the ends thereof. This coil type 26B has been found to even more effectively cancel the prepolarizing field outside the coils than the coil type 26A.

Figure 3A:
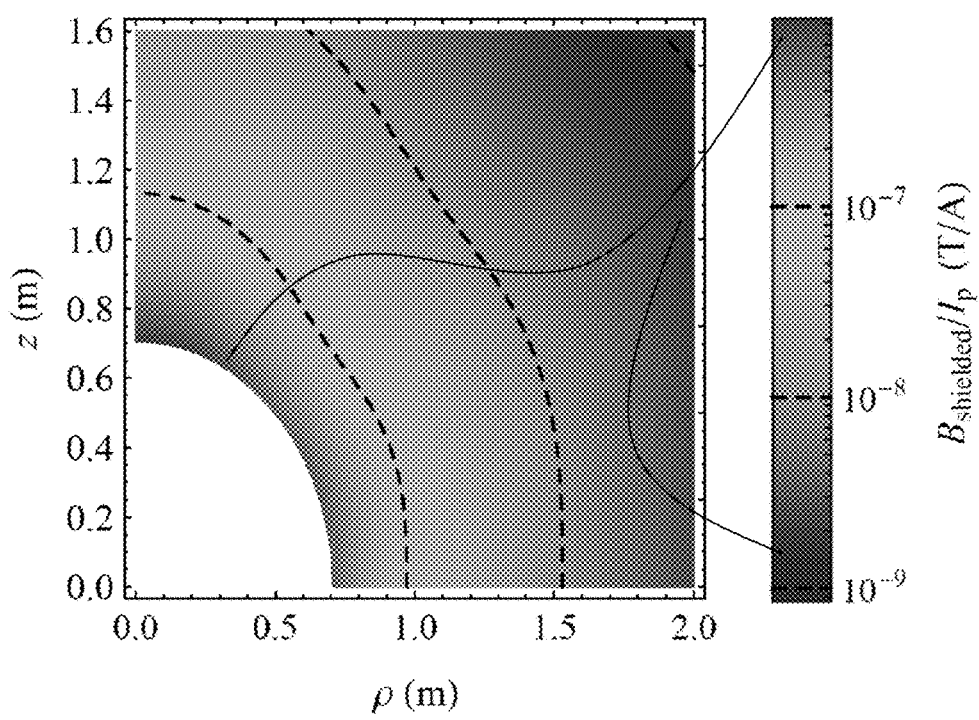
FIG. 3A shows calculated magnetic field amplitudes of the polarizing coil when it is connected in series with the cylindrical shielding coil according to FIG. 2A and having a length of 0.185 m, 27 turns and a diameter of 0.63 m.
Figure 3B:
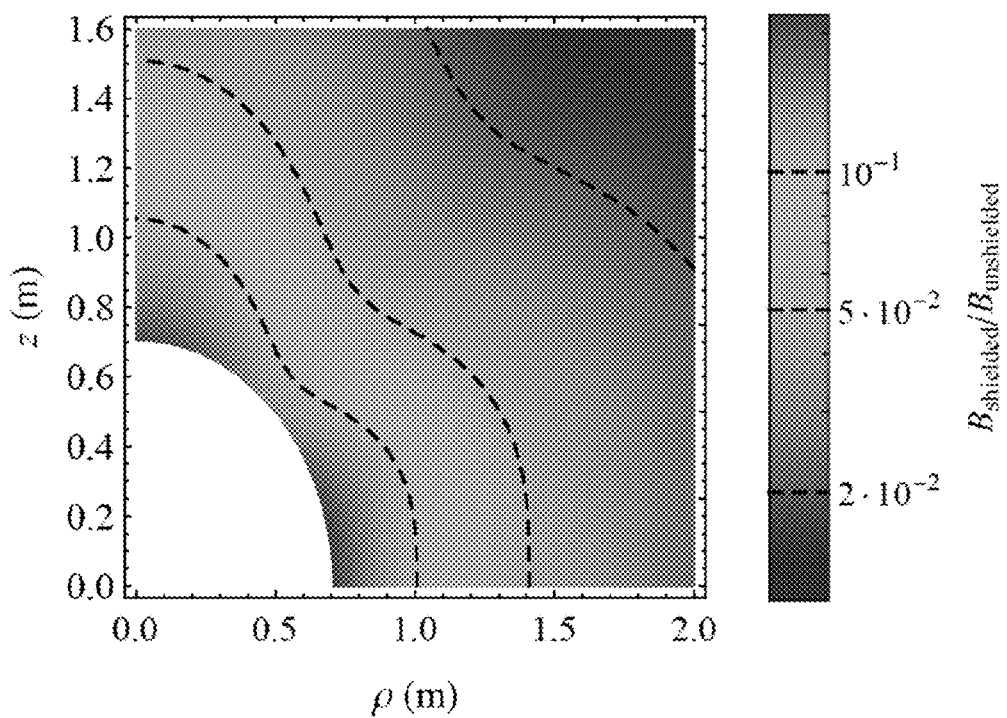
FIG. 3B shows the relative amplitude between the shielded and unshielded polarizing fields using the shielding coil illustrated in FIG. 2A and having a length of 0.185 m, 27 turns and a diameter of 0.63 m.

FIGS. 3A and 3B show the magnetic field amplitude (per 1 A of current) of a prepolarizing coil and the relative amplitudes of the field of the shielded and unshielded prepolarizing fields using the shielding coil according to FIG. 2A. As can be seen from FIG. 3B, the shielding has reduced the stray field amplitude to about 1/10 at the distance of about 1 m from the surface of the polarizing coil and to about 1/20 at the distance of about 1.5 m. FIG. 3A shows that at the distance of 1 m the field of the shielded polarizing coil is only about 0.1 µT/A, which permits the use of high currents in the polarizing coil resulting in a strong polarizing field.

Figure 4A:
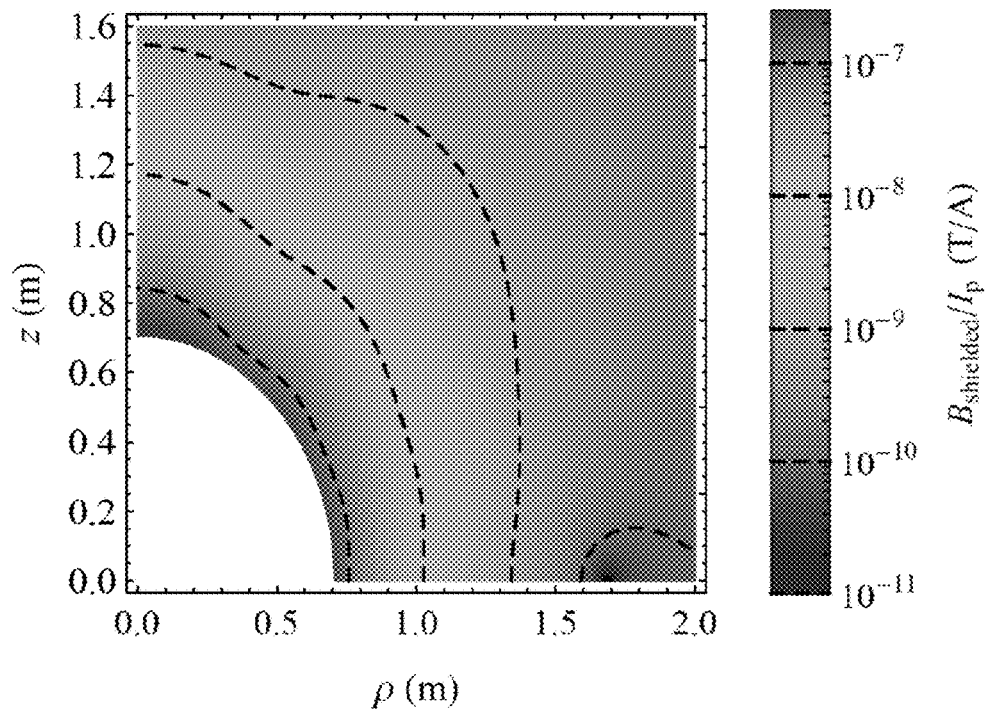
FIG. 4A shows calculated magnetic field amplitudes of the polarizing coil when it is connected in series with the cylindrical shielding coil according to FIG. 2B and having a length of 0.4 m, 27 turns wound according to FIG. 5 and a diameter of 0.63 m.
Figure 4B:
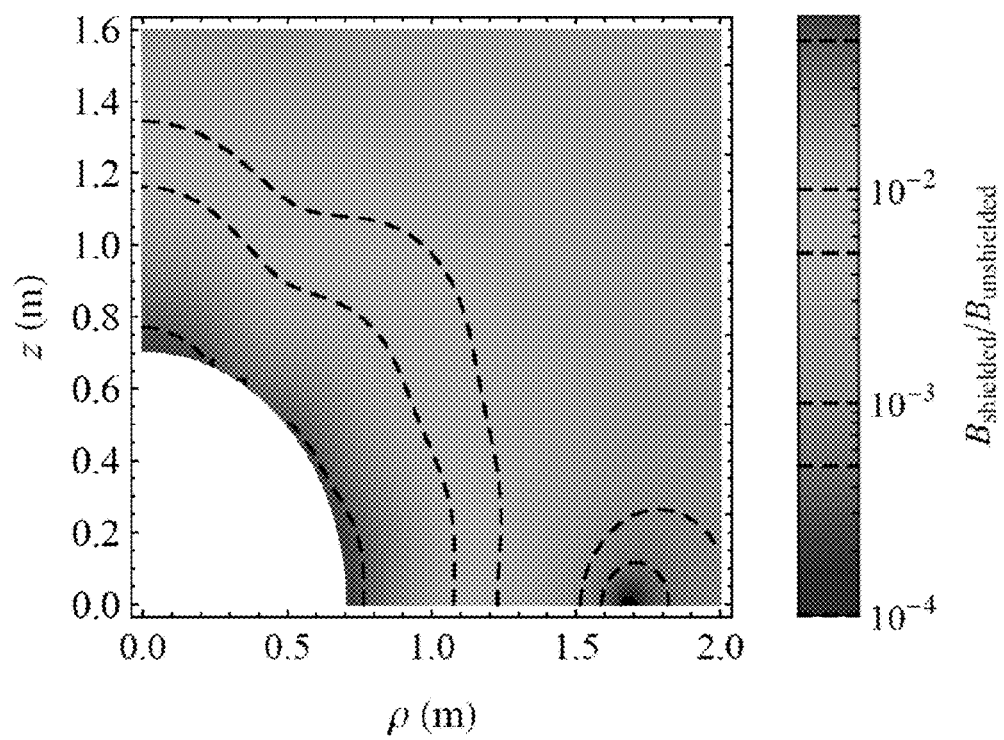
FIG. 4B shows the relative amplitude between the shielded and unshielded polarizing fields using the shielding coil illustrated in FIG. 2B and having a length of 0.4 m, 27 turns wound according to FIG. 5B and a diameter of 0.63 m.

FIGS. 4A and 4B show the magnetic field amplitude (per 1 A of current) of a prepolarizing coil and the relative amplitudes of the field of the shielded and unshielded prepolarizing fields using the shielding coil according to FIG. 2B. As can be seen from FIG. 4B, the shielding has reduced the stray field amplitude to about 1/100 at the distance of about 1 m from the surface polarizing coil.

Figure 5:
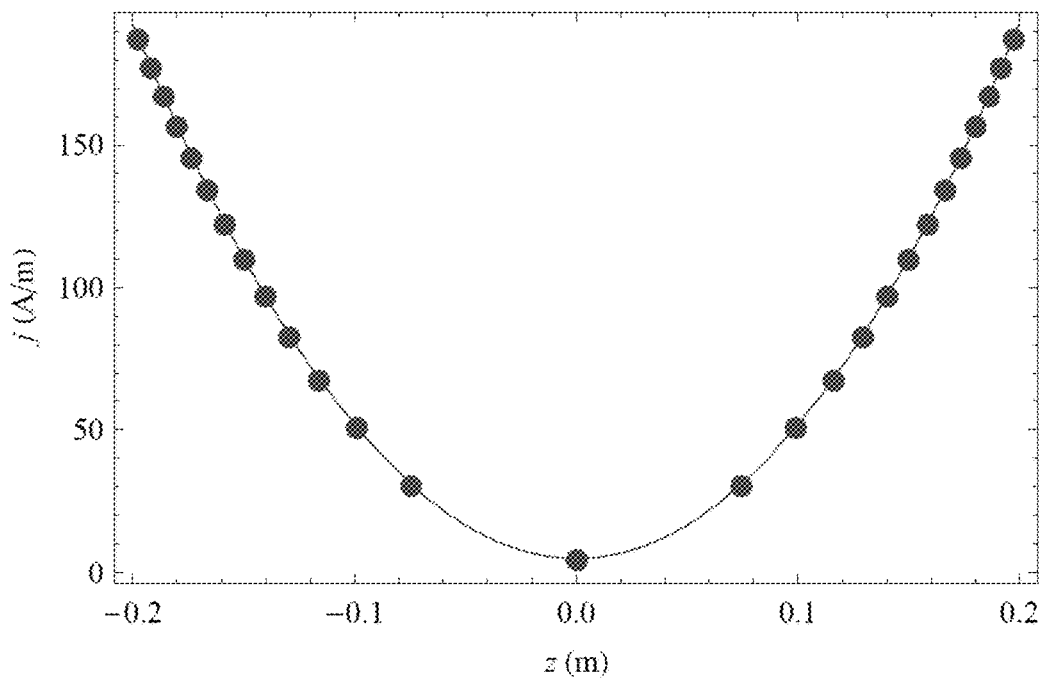
FIG. 5 shows as a graph a preferred winding pattern for the coil according to FIG. 2B. The dots mark the discrete wire positions along the length axis of the coil. Also shown is the continuous surface current density j obtained when a 1 A current flows in the polarizing coil.

FIG. 5 shows a preferred winding scheme for a coil according to FIG. 2B, designed to cancel the first four multipole moments of the prepolarizing coil. The dots in the figure show the wire positions in the shielding coil.

The design factors of the coils used in calculating the results of FIGS. 3-5 are given above in section "Brief Description of the Drawings".

Figure 6:
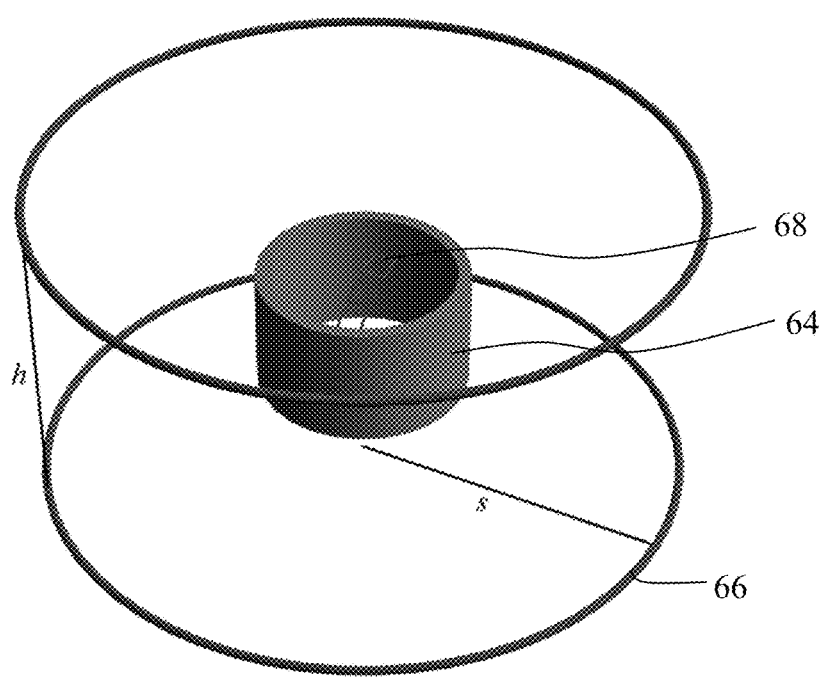
FIG. 6 illustrates a polarizing coil (inner) and shielding coil pair (outer) according to yet another embodiment of the invention and three SQUID sensor units in the polarizing coil. The radius, s, and the separation, h, of the shielding coil are shown in the figure.

FIG. 6 shows yet one alternative for shielding a solenoid-type prepolarizing coil 68. The shielding coil 66 comprises a pair of subcoils arranged symmetrically around the prepolarizing coil 68.

Figure 7:
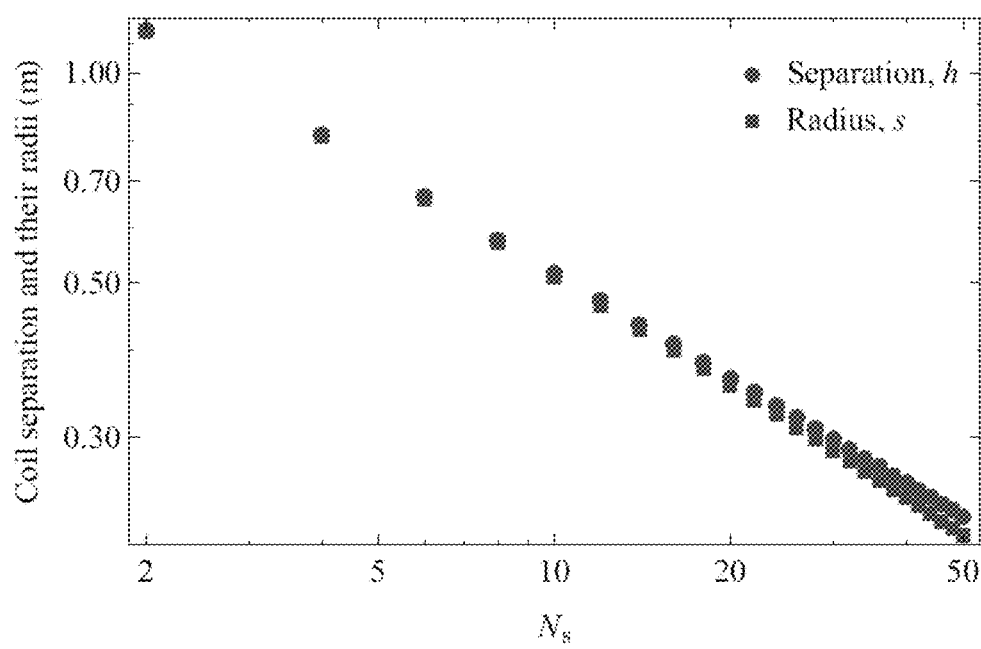
FIG. 7 shows design parameters of a symmetric pair of coils according to FIG. 6 that cancels the first four multipole moments of a polarizing coil according to FIG. 6. The vertical axis shows the total number of turns $N_s$ in the shielding coil.

FIG. 7 shows design parameters for the coil of FIG. 6, designed to cancel the first four multipole moments of a prepolarizing coil having the same parameters as discussed above with reference to FIGS. 3-5. The design parameters are the total number of turns $N_s$ in the coil, the separation h of the two subcoils that are symmetric with respect to the origin, and the radius s of the shielding coil.

In some variations of the invention, the shielding coil has a multilayer design, i.e., it comprises turns and/or subcoils having dissimilar diameters and/or shapes (the "layers" may be part of the same coil or may be formed using different subcoils). The layers can be coaxial with each other but they need not be. Further, the layers may be nonsymmetric. One layer may contain multiple layers of windings or a single winding layer or a variable number of winding layers.

Figure 9A:
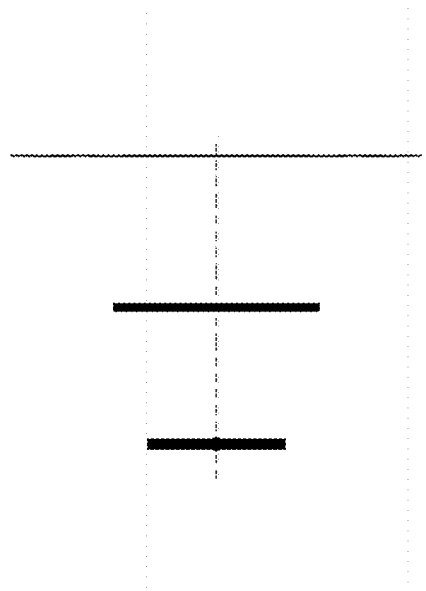
FIGS. 9a and 9b show an exemplary shielding coil arrangement with axial symmetry but having subcoils of different diameters.
Figure 9B:
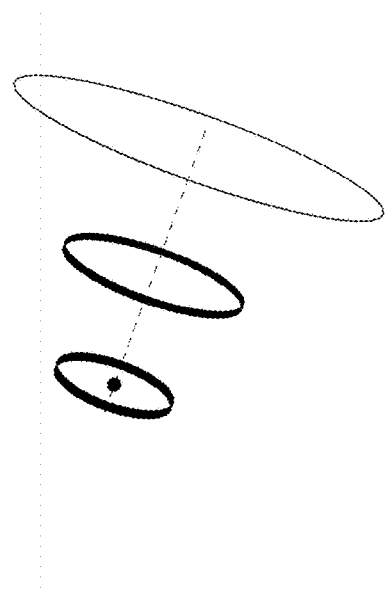

In one embodiment, the shielding coil comprises coaxial and symmetric subcoils. FIGS. 9A and 9B show an axially symmetric self-shielded polarizing coil design having subcoils with several diameters. The dashed line represents the z axis and the dot shows the origin used when calculating the multipole expansion. The coil is designed such that its dipole and quadrupole moments are zero. In the configuration shown, this condition is achieved with the following parameters: The coil around the origin has 90 turns with radius 0.2 m (z coordinate 0 m). The second coil has 76 turns with radius 0.3 m, and z coordinate 0.4 m; in this coil the current flows in the opposite direction with respect to the coil around the origin. The third coil has 9 turns, radius 0.6 m and z coordinate 0.84 m; the current flows in the same direction as in the coil placed around the origin.

Figure 10:
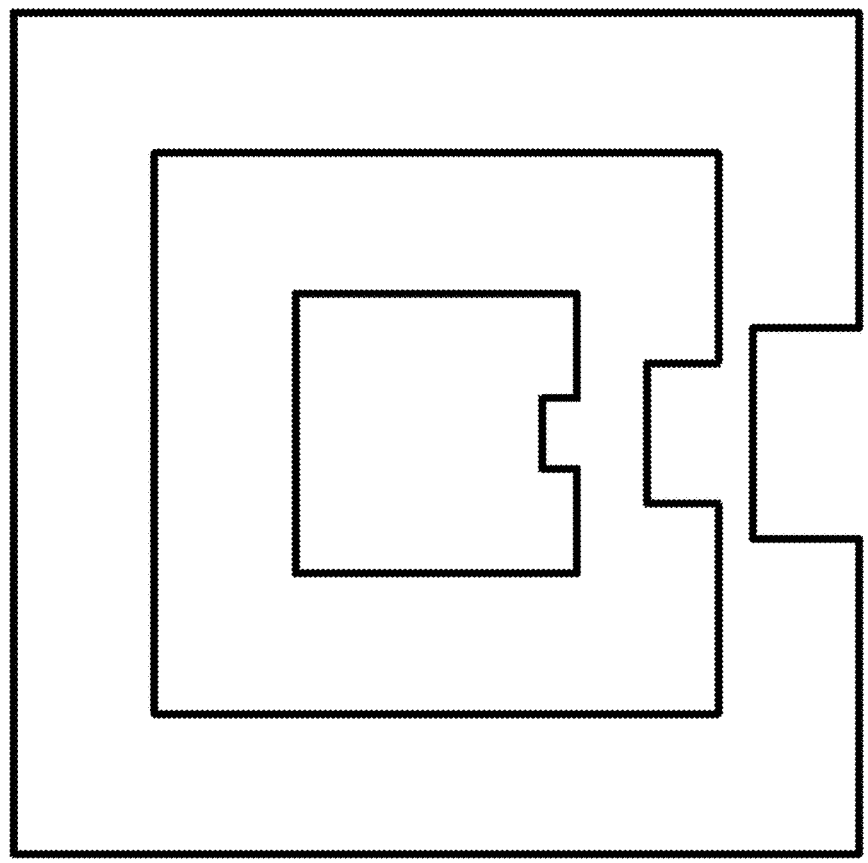
FIG. 10 shows an exemplary shielded polarizing coil without axial symmetry.

In one embodiment, the shielding coil comprises coaxial but not axially-symmetric subcoils. FIG. 10 shows a shielded polarizing coil without axial symmetry. This kind of a design is useful, when the geometry of the coil is restricted by some spatial limitations. The coil is designed such that its dipole and quadrupole moments, in all directions, i.e., the spherical multipole moments (l,m) for l=1, 2 and m=−l, −l+1 . . . , l−1, l, are zero. The coil is on the xy plane and the dimensions of the two coils around the centermost coil are two and three times the dimensions of the innermost coil. If the number of turns in the coils is 18, 9, and 2 (or these numbers multiplied by the same integer), for the innermost, middle and outermost coil, respectively, the current in the coils should be equal and in the middle coil its direction should be opposite with respect to the other two coils.

Non-Dynamic Shielding

As briefly described above, according to one embodiment, the shielding coil and the prepolarizing coil are series-connected with current flow in opposite directions. This arrangement is electronically simple to implement and ensures that the currents in the coils are always in the same phase and have the same amplitude. Of course, a similar effect can be achieved if the coils are not physically directly connected in series but equivalent waveforms are actively fed to the coils using suitable electronic control. Mathematically written, $I_s(t)=I_p(t)$, where $I_s(t)$ and $I_p(t)$ are the shielding and prepolarization pulses, respectively, and t is time.

If the shielding coil is larger and has fewer turns than the polarizing coil, non-dynamic shielding can be used to cancel some of the lowest-order multipole moments to an accuracy typically limited by the manufacturing process. By this method, the effects of eddy-current modes with the longest time constants typically become small. However, as the longest time constants can be on the order of a second, the remaining transient may still contain time constants as long as tens or hundreds of milliseconds. In some cases, such transients with low amplitudes may be tolerable, while, in others, it may be difficult to achieve sufficient shielding by this method, especially in applications where signals need to be measured within milliseconds after a polarizing pulse. Moreover, for a coil of size R and fixed shape with respect to the origin, the multipole moments per unit current are proportional to $R^{l+1}$, where l is the multipole order (1=dipole, 2=quadrupole, . . . ). Therefore, it seems inevitable that the moments with large l of the series-coupled pair of coils are in fact dominated by the shielding coil. As a result, the transient modes with shorter time constants may be substantially increased by the shielding coil (however, the total effect of the arrangement on the measurement being positive).

This non-dynamic approach can be generalized to dynamic shielding, as discussed below.

Dynamic Shielding

In dynamic shielding, the current profiles in the prepolarizing coil and the shielding coils are not similar in terms of waveform (phase and/or amplitude) at one or more temporal periods during the pulsing scheme. In other words, the prepolarization and shielding pulsing schemes are not similar. Using the dynamic shielding approach, one can go beyond design and manufacturing limitations of series-coupled shielding coils, where the currents in the two coils are always in phase with and equal to each other. By feeding time-varying current pulses in two or more coils, one achieves spatiotemporal coupling to transient modes, by which it is possible to reduce unwanted transients more than by other existing methods, while keeping the desired field pulse waveform.

The advantages of this method include better transient reduction compared to in-phase shielding, compensation for inaccuracy in coil design and fabrication, additional control over power dissipation and requirements for driving electronics, potentially relaxed coil-design constraints, and the possibility to optimize the effectiveness of the polarization or other desired properties. The optimum shielding pulse waveform for each system is not unique as it depends on the function space used. This adds to the flexibility of the method.

According to one embodiment, the shielding coil is passive (switched off) or operated at partial power lever for at least part of the duration of the prepolarization pulse. This enhances polarization of the sample as the cumulative field intensity in the sample is higher compared to a situation where the shielding would be active for the whole time of prepolarization. In addition, total power required to operate the coils is reduced.

According to one embodiment, the shielding coil is active (turned on) for at least part of the duration between two successive prepolarization pulses. This embodiment allows for taking time factors related to the transient fields better into account.

According to one embodiment, the measurement sequence follows the pulse sequence: PPF on, SF on, SF off, PPF off (PPF=prepolarization field; SF=shielding field).

The pulses need not be abrupt but may be shaped on switch-on, switch-off or both. In particular, the shielding pulses can be shaped so as to optimally suppress eddy currents or eddy current-induced fields at the sample. In some cases, it might be beneficial to provide two or more shielding pulses during one prepolarization cycle.

If the prepolarization and shielding fields are not switched on and/or off simultaneously, it should be ensured that the switch-on/off of the shielding field, or eddy currents emerging from the switch-on/off, does not disturb the measurement. Additional equipment needed for implementing dynamic shielding comprise driving electronics for the shielding coil and, optionally, means for measuring the transient. Decoupling the shielding and polarizing coils from each other by adding mutual-inductance cancellation turns in the coils leads to easier requirements for the electronics.

The driving electronics is adapted to produce a shielding pulse $I_s(t)$ of desired waveform into the shielding coil. Mathematically written, $I_s(t) \neq I_p(t)$ at least for some t, where $I_p(t)$ is the prepolarization pulse. The pulse forms can be mathematically constructed by using a suitable set of basis functions.

Mathematically, the total unwanted magnetic field at a position r can be expressed up to n:th order transient mode as $$\vec{B}_t(\vec{r}, t) = \sum_{k=1}^{n} x_k(t) \vec{\beta}_k(\vec{r}),$$

where k=1, 2, . . . , n, $\vec{\beta}_k(\vec{r})$ determines the magnetic field profile generated by eddy-current mode k at unit amplitude, and $x_k(t)$ is a time-dependent state of mode k which has a characteristic decay time constant $\tau_k > 0$.

Further, assuming that a prepolarization pulse ends before or at t=0, it can be derived that the condition for not leaving a transient after t=0 is $$\sum_{k=1}^{n} \frac{\vec{\beta}_k(\vec{r})}{\tau_k} \int_{-\infty}^{0} [m_{p,k} I_p(t) + m_{s,k} I_s(t)] e^{\frac{t}{\tau_k}} dt = 0,$$

where, $m_{p,k}$ and $m_{s,k}$, are the coupling coefficients (mutual inductances) of the prepolarization and shielding coils to the transient modes. Typically, this is equivalent to the integral being zero for each value of k separately.

Consider a polarizing coil and its shielding coil, which, per unit current, produce magnetic fields $\vec{\beta}_p(\vec{r})$ and $\vec{\beta}_s(\vec{r})$. The homogeneity requirement for the polarizing field is modest, so the spatial dependence over the sample volume can be omitted here. In the series-coupled in-phase shielding scheme, one typically has $|\beta_s|\ll|\beta_p|$ at the sample, i.e., the shielding does not significantly decrease the polarizing field. This is easily achieved with roughly circular coils, for instance, by making the radius of the shielding coil ($R_s$) twice as large as that of the polarizing coil ($R_p$), which leads to a decrease of the polarizing pulse by only ⅛, i.e., $(R_p/R_s)^3$. This setting is attractive also from a dynamic shielding point of view, since the current in the shielding coil can be varied significantly while not largely affecting the polarizing field.

The shielding pulse $I_s(t)$ can be designed in such a way that, at t=0, a larger number of transient modes have been driven to zero than is practically possible simply by a series-coil design. In principle, one can zero any transient mode that the shielding coil couples to, and differences in the time constants provide, in a sense, independent control over the separate modes. This requires features of the shielding pulse at time scales comparable to the modes to be controlled. This can be achieved, for instance, by taking a weighted sum of suitable basis functions. The weighting coefficients can, for instance, be found by an iterative minimization algorithm set to minimize the integral of the squared transient according to measurements or theory.

In case the effective polarizing field waveform is changed too much, one can adjust $I_p(t)$ accordingly so that the effective pulse is still as intended. Further, one may want to express both $I_p(t)$ and $I_s(t)$ in terms of basis functions, while requiring that the total field at the sample has the desired pulse shape. Additional concerns such as power dissipation, voltage, or current can be added as constraints or into the goal function. For lower power dissipation or other reasons, it can be advantageous to start the cancellation pulse later than the actual pulse if the latter is long compared to the transient time constants. With these optimizations, the shielding pulse may be far from zeroing the coupling to selected modes at all times during the pulse, but provide much better overall results.

For a practical implementation of dynamic shielding, one chooses a suitable function basis or another way to express $I_s(t)$ in terms of a finite set of v values. While many linear and nonlinear function spaces can be well suitable, some requirements must be met. First, the pulse should be such that it can be produced in practice. If a suitable function space is chosen, the practical requirements can indeed be included in the optimization problem. Second, $I_s(t)$ should be able to have features at timescales comparable to the time constants $\tau_{k_\alpha}$ of the transient modes $k_\alpha$, $\alpha=1, 2, \ldots$ m to be canceled. Of possible function bases $$(\phi_\alpha(t))_{\alpha=1}^{v}$$

one example is ($\tilde{\tau}_\alpha$ can be chosen to be roughly $\tau_{k_\alpha}$)

$$\phi_\alpha(t)=[1-\exp(5t/\tilde{\tau}_\alpha)]\exp(-t^4/(3\tilde{\tau}_\alpha)^4), \text{when } t<0;$$

$$\phi_\alpha(t)=0 \text{ for } t\geq 0.$$

To form the basis, it is useful to at least roughly know the time constants of the harmful modes. They can also be found iteratively by starting with the most evident time constants and adding more basis functions as additional harmful modes are revealed. Alternatively, basis functions can be added throughout the range of relevant time scales, regardless of whether such transient modes are present. More general function spaces based on, e.g., Fourier or wavelet representations can also be convenient because of their flexibility. A large number of basis functions can cause the problem of finding the coefficients to be highly underdetermined, which leaves a lot of flexibility for reaching other optimization goals than making the transient small.

According to one embodiment, the shielding pulse is based on an in-phase shielding pulse that causes some multipole moments of the polarizing and shielding coils together to be small at all times, and is superposed with a dynamic waveform for fine tuning. The waveforms can then take the forms $$I_s(t) = -\eta_p B_p(t) + \sum_{\alpha=1}^{v} \eta_\alpha \phi_\alpha(t), \text{ and}$$

$$I_p(t) = \frac{1}{\beta_p}B_p(t) - \frac{\beta_s}{\beta_p}I_s(t),$$

where $B_p(t)$ is any desired polarizing pulse waveform. The second term in the expression for $I_p(t)$ ensures that $\beta_p I_p(t)+\beta_s I_s(t)=B_p(t)$. If $\beta_s$ is sufficiently small, the correction term can be omitted. The coefficients $\eta_\alpha$ can be optimized to yield the best results. If $\eta_p$ is fixed at the value that cancels low multipole moments, one has the advantage that the fine tuning may not need to be retuned every time the duration of a square polarizing pulse is changed. Further, if the system is linear, the fine tuning can also be scaled to match any $B_p$ pulse amplitude.

The number of basis functions or degrees of freedom in the cancellation function space can of course be different from the number of transient modes to be canceled. A larger number may be required in order to satisfy additional constraints set in the optimization, while a smaller number may be sufficient in some cases. The functions may also be described in a nonlinear way or be forced to meet some requirements during the optimization.

Figure 11:
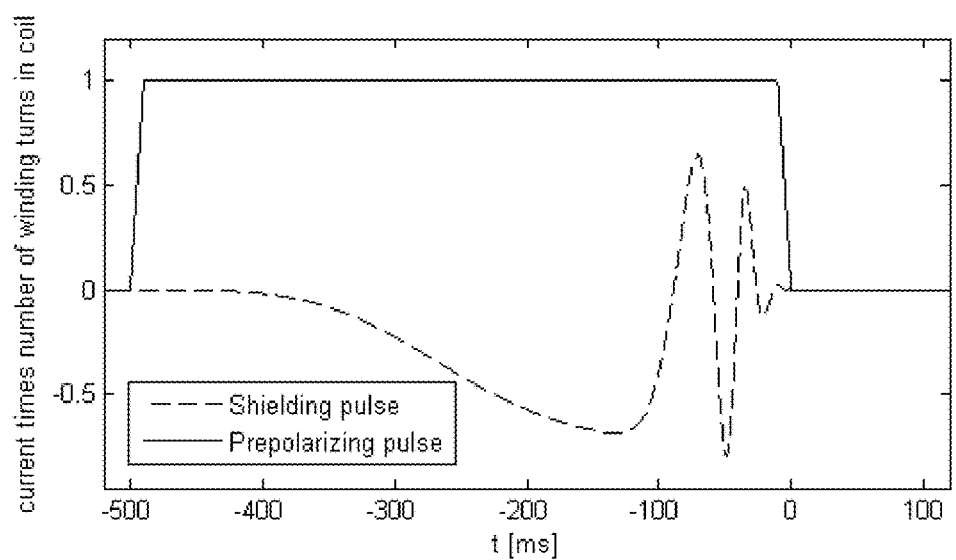
FIG. 11 illustrates an exemplary dynamic shielding pulse.

FIG. 11 illustrates a shielding pulse example for a computational model system (constant-magnitude prepolarizing pulse) with a spherically symmetric aluminum magnetic shield with a radius of 2 m and a thickness of 2 mm. The prepolarizing coil has a radius of 0.1 m and is circular and centered at the center of the shield. A concentric and coplanar shielding coil of radius 0.3 m is fed with a dynamic shielding waveform, which nulls the subsequent transients in the eddy-current modes that correspond to the 11 longest time constants in the magnetic shield. As can be seen from FIG. 11, the shielding pulse may be variable during the prepolarization pulse. In particular, it may be alternating. It may also have a variable frequency profile in time, i.e., it has at least two temporal regions with different frequencies. In particular, the frequency of the shielding pulse may be higher towards the end of the prepolarization pulse, as shown in FIG. 11.

Further considerations in dynamic cancellation include controlling the direct inductive coupling between the shielding coil and the actual coil.

Figure 12:
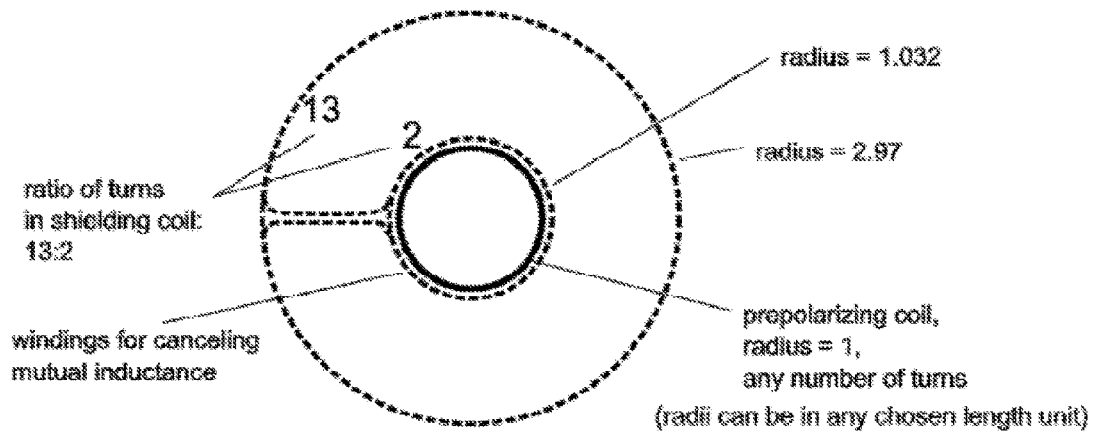
FIG. 12 shows an example arrangement for minimizing the mutual inductance between the shielding and prepolarization coil.

In one embodiment, to ease the requirements for the current-source electronics, one decouples the coils from each other using transformers, or, as is likely more convenient, by making one or more additional winding turns in the shielding coil close to the polarizing coil in such a way that the mutual inductance is close to zero. A simple schematic example of decoupling with additional windings is depicted by FIG. 12. Decoupling turns can alternatively or additionally be added to the prepolarizing coil. When there are more than two coils in the system, all the desired mutual inductances of the coils can be made small in a similar fashion. Without decoupling the coils, the coil-driving electronics may be unable to produce the desired waveforms because of large induced EMFs.

FIG. 12 shows a schematic example of a setup where additional winding turns in the shielding coil cancel the mutual inductance of the prepolarizing coil and the shielding coil. The numbers are for coils that consist of sets of ideal circular windings.

A notable advantage of dynamic shielding compared to in-phase shielding is that superior transient reduction can be achieved by going beyond limitations given by the coupling strengths of the shielding coil to the transient modes. Moreover, power dissipation and requirements in, e.g., current or voltage can be made lower by using well-chosen waveforms.

Dynamic shielding can be generalized to any number of inputs, or coils, with geometries and currents set up to create the desired pulse but no harmful transients. However, using a single $B_p$ and just changing the pulse shape is very limited in applicability if the transient time constants of the harmful modes are long; the $B_p$ waveform is compromised when features of such characteristic time scales are added. Still, as mentioned earlier, eddy current compensation has been done for conventional MRI gradients by only reshaping pulses. The technique, however, relies heavily on canceling the effects of the eddy currents instead of reducing the cause; most of the compensation is added after instead of before a current ramp. Conventional MRI systems with shielding coils for gradients may also be improved with dynamic shielding similar to what is described here.

If pulsing the shielding coil has a significant effect on the desired field, one can also optimize the waveform or effect of the field pulse at the sample. This way the shielding pulse may even positively contribute to the field during part of the pulse, although, close to the end of the pulse, a negative impact seems practically inevitable. If the harmful transient modes have shorter time constants than the relaxation times of the sample, including this consideration in the optimizations may yield a positive net effect for prepolarization.

Although a shielding coil designed for series coupling can, apart from the mutual inductance issue, be very suitable for dynamic shielding, the compatibility of the shielding coil with in-phase shielding is not a requirement. In principle, it is enough to have sufficient coupling to the harmful transient modes. The number of turns in the shielding coil can be designed with electronics and cooling in mind, and the coil geometry can be designed more freely to fit spatial constraints. Even more freedom is achieved if one does not attempt to eliminate the transient completely, but only the modes that are interfering with the measurement as noise or otherwise.

To find suitable shielding pulses, it is not always necessary to solve the optimization problem for every desired field pulse shape. If the transient system is sufficiently linear, it is in fact enough to find a shielding pulse for a delta function or a short impulse in the polarizing pulse (or its derivative). Considering the desired pulse shape as a superposition of such impulses at different instants of time, the shielding pulse is found by convolving the impulse shielding with the desired pulse shape (or its derivative). If the currents in the coils must be zero quickly after the end of the polarizing pulse, the convolution kernel becomes anticausal, i.e., the shielding pulse occurs before and during ramps. This may be a downside if the shielding pulse extends too far in time before the beginning of the polarizing pulse, interfering with a previous acquisition. An approach to solving this issue for long pulses is to use a causal convolution for the first half of the pulse and a non-causal one for the second half, or to vary the convolution kernel over the pulse duration in a more sophisticated manner. As a generalization of the convolution method for a system of N coils for creating the desired field and shielding, the convolution kernel becomes an N-vector that is a function of a time variable Then again, dynamic shielding can be effective also in systems where the transients contain oscillations or even nonlinearities. Using temporally varying pulses provides an unlimited number of shielding parameters that are easily tunable compared to those provided by shielding coil design.

Experimental Verification

The invention was tested using a cylindrical polarizing coil with $N_p$=211 turns of 3-mm copper wire in five layers, height $h_p$=0.14 m, and inner and outer radii $s_{in}$=0.105 m and $s_{out}$ of 0.12 m, respectively. The polarizing coil, with its axis in the vertical direction was located approximately at the center of a double-layer MSR. Both layers had an inner mu-metal shell and an outer aluminum shell. The height, width, and length of the innermost shielding layer were 2.76, 3.11, and 4.11 m, respectively.

The current in the polarizing coil was switched off rapidly with a dedicated circuit allowing one to reduce the polarizing field nearly linearly to zero in 1 ms. Such a rapid decay induced eddy currents in conductive materials, most notably in the aluminum layers of the magnetically shielded room around the measurement instrument.

The setup comprised three planar sensor modules, each having two orthogonal SQUID gradiometers, with a baseline of 18 mm and pickup loops comprising 13 mm×31 mm rectangles and one SQUID magnetometer with a square 27 mm×27 mm pickup loop.

The sensors were situated on a curved bottom surface of a fiberglass dewar, surrounded by the polarizing coil. The normals of the sensor modules formed angles of 12, 30, and 48 degrees with the vertical direction. 250-μm-thick and 13-mm-wide niobium plates were placed below and above the SQUID chip to provide local protection against the external field. Consequently, the sensors spontaneously recovered from the prepolarization without the need to heat them.

The eddy-current-related magnetic fields were measured with the three SQUID magnetometers. A static polarizing field was applied for 2900 ms, after which it was switched off in 1 ms. The rise time of the field was less than 30 ms. At 200 ms, the signal acquisition began after resetting the flux-locked loop of the SQUIDS; when measuring the eddy-current fields with the shielded polarizing coil shortly after the polarization, the acquisition started 15 ms after the polarization. The experiments were carried out both with and without the shielding coil. Signals were sampled at 100 kHz.

Figure 8:
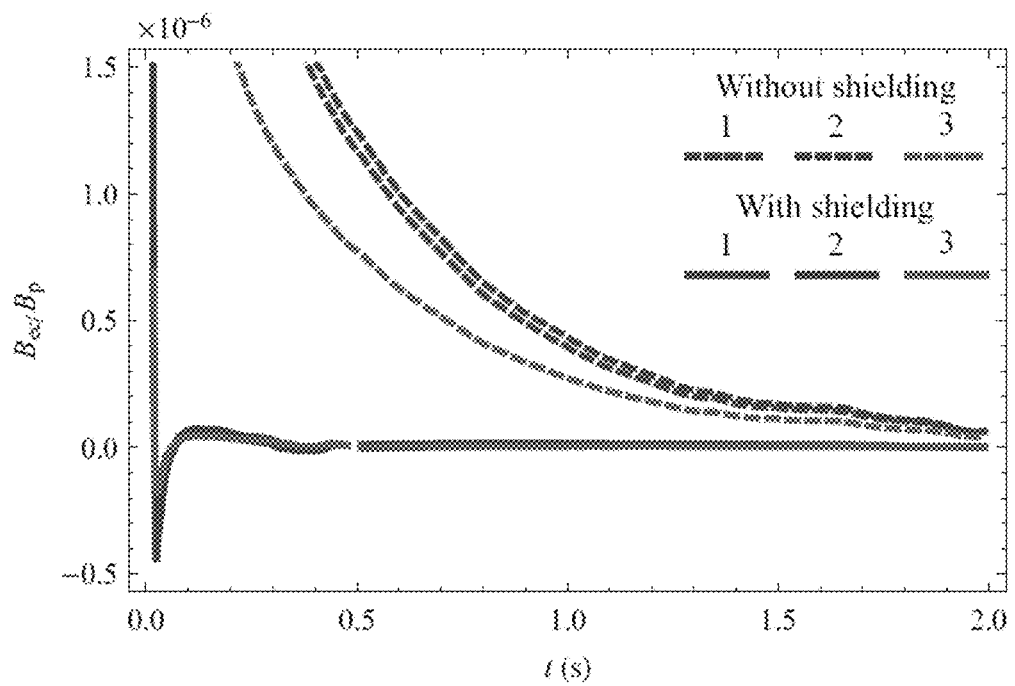
FIG. 8 illustrates an eddy-current-induced magnetic field $B_{ec}$ measured with the three SQUID sensors according to FIG. 6 after the polarizing field is switched off. t is the time after the field switch-off. $B_p$ is the polarizing field at the center of the polarizing coil.

FIG. 8 shows the ratio of eddy-current-induced field strength to polarizing field strength of unshielded (dashed lines) and shielded (solid lines) coils according to FIG. 6. The field data of FIG. 8 was measured using the three SQUID magnetometers described above (different curves for each) with and without the shielding coil; to remove high-frequency noise, the curves were moving-average filtered. When using the polarizing coil without shielding, the applied current was 600 mA, corresponding to a polarizing field $B_p$=0.61 mT; the signal acquisition started 200 ms after the field switch-off. With the shielded polarizing coil, we measured the eddy-current-related magnetic fields in two parts. The initial part from 15-500 ms was measured using a polarizing field $B_p$=0.43 mT, which was achieved with a current of 440 mA. This guaranteed that all the magnetometers were working properly shortly after the field switch-off. The latter parts of the curves were obtained with a stronger polarizing field, $B_p$=7.9 mT, achieved with a current of 8.1 A, to increase the SNR of the eddy-current field measurement.

As can be seen, when the polarizing field is applied without shielding, the measured magnetic fields are strong and decay exponentially with long time constants. By fitting the data with a sum of two exponential functions, we found time constants 100 ms and 500 ms. By extrapolating, we found that the vertical components of the eddy-current related magnetic fields at t=0 would have been $5\text{-}7 \cdot 10^{-6} B_p$, where $B_p$ is the vertical polarizing field at the coil center. However, this is probably an underestimate of the magnetic fields originating from the eddy currents, because the data do not reveal fields that decay with short time constants.

FIG. 8 clearly demonstrates the benefit of using a self-shielded polarizing coil. For example, 200 ms after the polarization the magnetic field with the unshielded polarizing coil is about 50 times higher than the field produced with the shielded coil. This result is in good agreement with the calculated magnetic fields of FIGS. 3A and 3B; in these figures, we see that at the distance of the walls of the MSR, the unshielded magnetic field is approximately 20-50 times higher than the shielded field.

Figure 13:
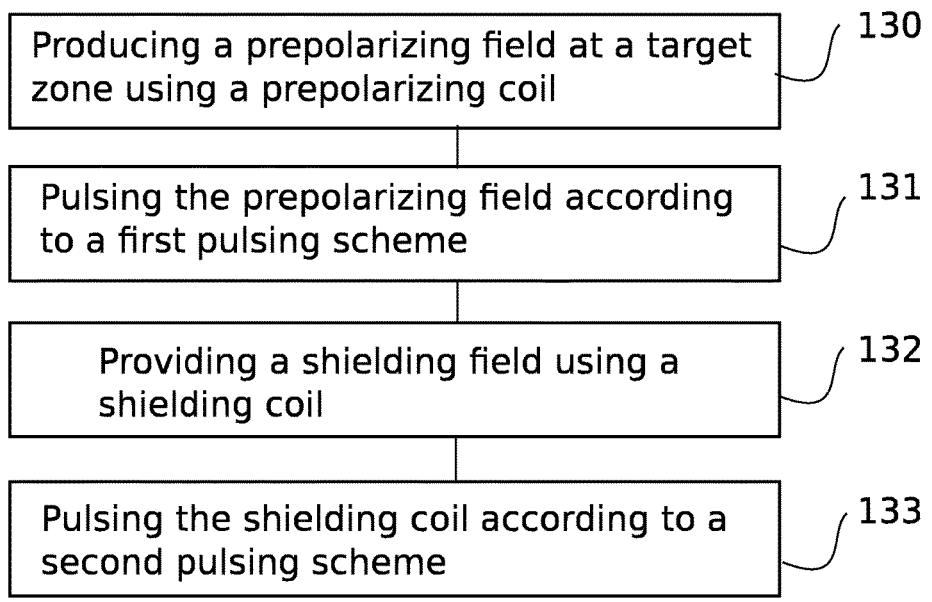
FIG. 13 shows a method according to at least certain embodiments of the present invention.

FIG. 13 illustrates the steps of a method according to at least certain embodiments of the present invention as a schematic flow-chart. As can be seen the method comprises producing a prepolarizing field at a target zone using a prepolarizing coil 130. Pulsing the prepolarizing field according to a first pulsing scheme 131. Providing a shielding field using a shielding coil 132. Pulsing the shielding coil according to a second pulsing scheme 133.

The invention claimed is:

1. A prepolarizing magnetic resonance- or relaxation-based measurement system comprising:
    a prepolarizing coil for producing a prepolarizing magnetic field at a target zone, the prepolarizing coil being configured to
    pulse the prepolarizing magnetic field according to a first pulsing scheme,
    means for measuring target-induced magnetic fields of a target placed in the target zone,
    a shielding coil for producing a shielding field, the shielding coil being configured to pulse
    the shielding field according to a second pulsing scheme, whereby the shielding coil, the second pulsing scheme or both are arranged to reduce the formation of unwanted transient fields caused by the coupling of the prepolarizing coil to conducting or magnetic structures in the surroundings of the prepolarizing coil.

2. The system according to claim 1, wherein the prepolarizing coil and the shielding coil are coupled in series, or the system is configured to feed the coils with identical and temporally similar current waveforms in the first and second pulsing schemes, such that the directions of currents in the coils oppose each other in terms of producing eddy-current transients.

3. The system according to claim 1, wherein the system is configured to provide waveforms for producing temporally dissimilar first and second pulsing schemes and to pulse the shielding coil in a synchronized manner with the prepolarizing coil but with a different current waveform, switching the shielding field off or operating it at partial power level for at least part of the duration of the prepolarization field.

4. The system according to claim 1, wherein the total magnetic dipole moment of the shielding coil and the prepolarizing coil is smaller than ¹⁄₁₀ of the dipole moment of the prepolarizing coil.

5. The system according to claim 1, wherein the prepolarizing coil has the form of a solenoid with equally or non-equally spaced turns.

6. The system according to claim 1, wherein the system is intended to be used in ultra-low-field magnetic fields, where the strength of any other magnetic fields in the target region are 10 mT or less.

7. The system according to claim 1, further comprising:
    means for producing other magnetic fields at the target zone,
    means for forming an image of the target based on magnetic measurements, and
    one or more induction coils, SQUID sensors, atomic magnetometers, or sensors based on giant magnetoresistance (GMR) for sensing target-induced magnetic fields during the measurement, in particular during MRI measurement.

8. The system according to claim 1, wherein the coupling constant describing mutual inductance between the prepolarizing coil and the shielding coil is small, in particular less than 0.1.

9. The system according to claim 1, wherein the shielding coil comprises
    an outer winding arrangement and an inner winding arrangement closer to the prepolarizing coil than the outer winding arrangement in order to reduce the mutual inductance of the shielding and prepolarizing coils and
    a plurality of subcoils.

10. The system according to claim 1, wherein the shielding coil has a diameter and a winding scheme that provide a magnetic field pattern that, when pulsed by said second pulsing scheme, at least partly cancels the magnetic field of the prepolarizing coil.

11. The system according to claim 10, wherein the shielding coil:
    is positioned coaxially with the prepolarizing coil
    has a number of winding turns smaller than the number of winding turns of the prepolarizing coil,
    has an outer dimension which is at least 1.5 times that of the prepolarizing coil
    has the form of a solenoid with a first distance between adjacent turns in the middle of the solenoid being larger than a second distance between adjacent turns at the ends of the solenoid
    comprises a pair of subcoils symmetrically positioned around the prepolarizing coil
    is configured so as to cancel the magnetic field of the prepolarizing coil at a distance of 1 m from the surface of the prepolarizing coil to the level of 20% or less
    is configured so as to cancel at least the first two, preferably the first four, magnetic multipole moments of the prepolarizing coil in such a way that the magnetic field produced by these multipole moments at the distance of 1 meter from the system is reduced to 10% or less from that produced by the corresponding multipole moments of the prepolarization coil.

12. The system according to claim 1, wherein the second pulsing scheme is configured to in synchronized relationship with the first pulsing scheme to provide a magnetic field pattern in said shielding coil that at least partly cancels the magnetic field of the prepolarizing coil.

13. The system according to claim 1, wherein the shielding coil has a diameter and a winding scheme that when pulsed with said second pulsing scheme having a synchronized relationship with said first pulsing scheme, in combination is configured to provide a magnetic field pattern in said shielding coil that at least partly cancels the magnetic field of the prepolarizing coil at a distance of 1 m from the surface of the prepolarizing coil to the level of 20% or less, preferably to a level of 5% or less.

14. A method in prepolarization-based magnetic resonance or magnetic relaxation measurement system, the method comprising
  producing a prepolarizing field at the target zone using a prepolarizing coil,
  pulsing the prepolarizing field according to a first pulsing scheme,
  providing a shielding field using a shielding coil, which is pulsed according to a second pulsing scheme, wherein the shielding field, the second pulsing scheme or both are adapted to reduce the formation of unwanted transient fields caused by the coupling of the prepolarizing coil to conducting or magnetic structures in the surroundings of the prepolarizing coil.

15. The method according to claim 14, wherein the current waveform of the second pulsing scheme is identical and temporally similar to the current waveform of said first pulsing scheme.

16. The method according to claim 15, wherein said shielding coil is pulsed with said second pulsing scheme in order to provide a magnetic field pattern that at least partly cancels the magnetic field of the prepolarizing coil.

17. The method according to claim 14, wherein the shielding coil is pulsed according to said second pulsing scheme in a temporally dissimilar but synchronized manner with the prepolarizing coil pulsed with said first pulsing scheme.

18. The method according to claim 17, wherein said shielding coil is pulsed with said second pulsing scheme which is temporally dissimilar from and having a different current waveform than said first pulsing scheme, in order to provide a magnetic field pattern that at least partly cancels the magnetic field of the prepolarizing coil.

19. The method according to claim 14, wherein the shielding field suppresses the prepolarizing field by not more than 20% at the region of the target and by more than 80% at a distance of 1 m from the prepolarizing coil producing the prepolarization field.

20. The method according to claim 19, wherein the shielding coil is capable of suppressing the prepolarizing field by more than 95% at a distance of 1 m from the prepolarizing coil.

21. The method according to claim 14, wherein the shielding pulses are oscillatory and each comprises at least two time periods with different oscillation frequencies.

22. The method according to claim 14, wherein said shielding coil is pulsed with said second pulsing scheme in order to provide a magnetic field pattern that at least partly cancels the magnetic field of the prepolarizing coil.

23. The method according to claim 14, wherein said shielding coil is pulsed with said second pulsing scheme which is temporally dissimilar from and having a different current waveform than said first pulsing scheme, in order to provide a magnetic field pattern that at least partly cancels the magnetic field of the prepolarizing coil.

* * * * *